United States Patent
Xie et al.

(10) Patent No.: US 9,564,381 B2
(45) Date of Patent: *Feb. 7, 2017

(54) APPARATUS AND METHOD TO MONITOR DIE EDGE DEFECTS

(71) Applicant: Intel Corporation, Santa Clara, CA (US)

(72) Inventors: Mayue Xie, Phoenix, AZ (US); Zhiyong Wang, Chandler, AZ (US); Yuan-Chuan Steven Chen, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/876,728

(22) Filed: Oct. 6, 2015

(65) Prior Publication Data

US 2016/0043011 A1 Feb. 11, 2016

Related U.S. Application Data

(63) Continuation of application No. 13/713,935, filed on Dec. 13, 2012, now Pat. No. 9,159,646.

(51) Int. Cl.
*G01R 31/02* (2006.01)
*H01L 21/66* (2006.01)
(Continued)

(52) U.S. Cl.
CPC ............ *H01L 22/34* (2013.01); *G01R 31/2642* (2013.01); *H01L 22/32* (2013.01); *H01L 23/48* (2013.01); *H01L 23/50* (2013.01); *H01L 27/0207* (2013.01); *H01L 27/0255* (2013.01); *H01L 27/0296* (2013.01); *H01L 27/0676* (2013.01);
(Continued)

(58) Field of Classification Search
CPC ............ H01L 2224/48247; H01L 2224/73265; H01L 22/34; H01L 24/06; H01L 2224/73215; H01L 24/48; H01L 25/0655; H01L 2225/06551; H01L 2224/48257; H01L 2224/49171; H01L 2224/92247; H01L 23/481; H01L 21/67253; H01L 22/12; H01L 2224/48227; H01L 21/67288; H01L 23/48; H01L 29/66212; G01R 31/31715; G01R 31/318511; G01R 31/318505; G01R 31/2884; G01R 31/2635; G01R 31/2656; G01N 21/9503; G01N 2021/556; G01N 21/9505; G01N 21/958; G01N 21/952; G01N 2021/8858
See application file for complete search history.

(56) References Cited

U.S. PATENT DOCUMENTS 3,974,443 A 8/1976 Thomas
3,983,479 A 9/1976 Lee et al.
(Continued)

Primary Examiner — Vinh Nguyen
(74) Attorney, Agent, or Firm — Blakely, Sokoloff, Taylor & Zafman LLP

(57) ABSTRACT

Described is an apparatus comprising: an input pad; an output pad; a wire, coupled to the input pad and the output pad, the wire positioned at a periphery of a semiconductor die, the wire extending substantially along a perimeter of the semiconductor die; and one or more diodes, coupled at various sections of the wire, and positioned along the perimeter of the semiconductor die and surrounding the semiconductor die.

20 Claims, 10 Drawing Sheets

(51) Int. Cl.
| | |
|---|---|
| H01L 23/48 | (2006.01) |
| G01R 31/26 | (2014.01) |
| H01L 27/02 | (2006.01) |
| H01L 23/50 | (2006.01) |
| H01L 27/06 | (2006.01) |
| H01L 49/02 | (2006.01) |
| H01L 29/861 | (2006.01) |

(52) U.S. Cl.
CPC ............. *H01L 28/20* (2013.01); *H01L 29/861* (2013.01); *H01L 2924/0002* (2013.01)

(56) References Cited

U.S. PATENT DOCUMENTS

| | | | |
|---|---|---|---|
| 4,801,869 A | | 1/1989 | Sprogis |
| 5,561,367 A | * | 10/1996 | Goettling ........... G01R 31/2853 324/750.3 |
| 5,615,216 A | * | 3/1997 | Saeki ...................... G06F 11/22 324/523 |
| 5,650,727 A | | 7/1997 | Lapping et al. |
| 9,159,646 B2 | * | 10/2015 | Xie ..................... H01L 27/0296 |
| 2001/0040456 A1 | | 11/2001 | Kikuchi |
| 2004/0257090 A1 | | 12/2004 | Barr et al. |
| 2011/0101990 A1 | | 5/2011 | Noorlag et al. |

\* cited by examiner

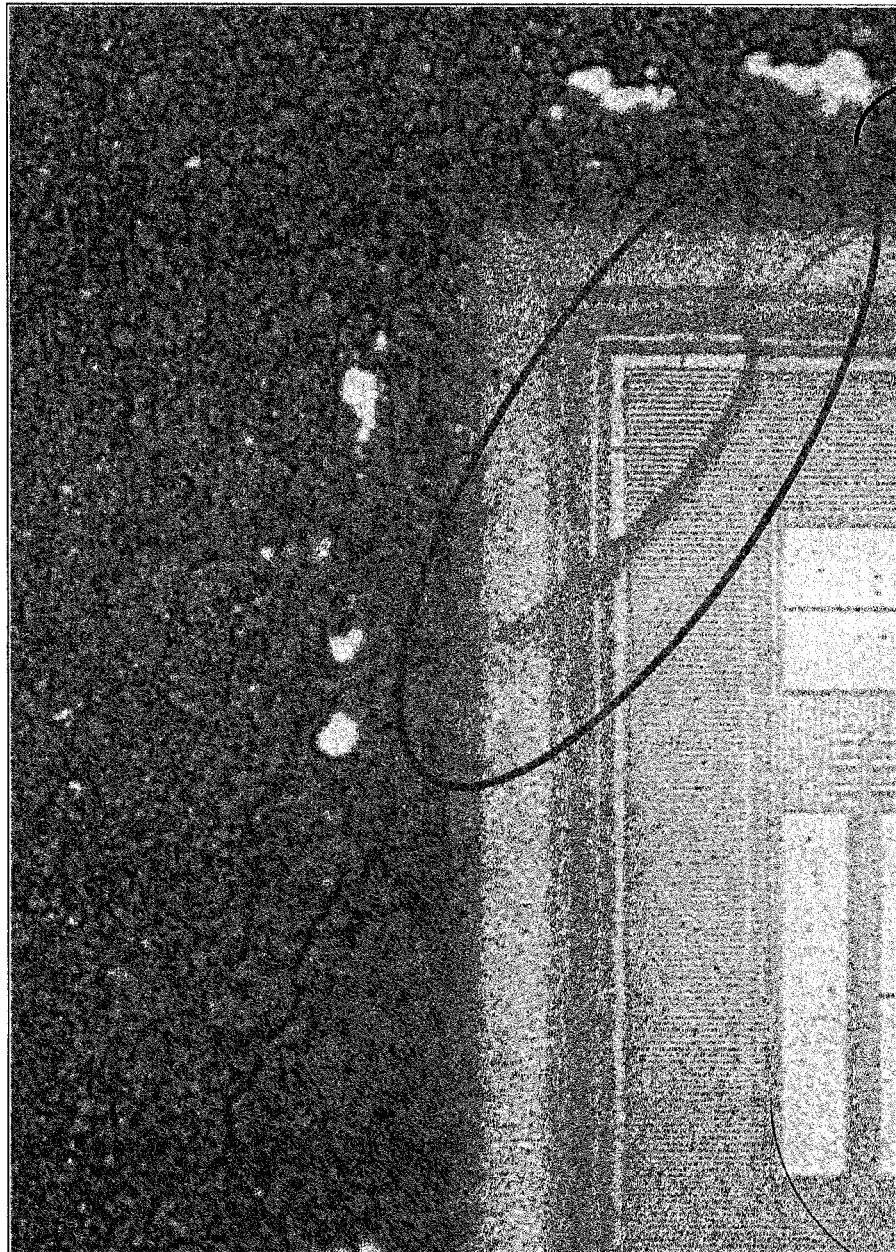

US 9,564,381 B2

APPARATUS AND METHOD TO MONITOR DIE EDGE DEFECTS

CROSS-REFERENCE TO RELATED APPLICATIONS

This application is a continuation application of U.S. patent application Ser. No. 13/713,935, filed on Dec. 13, 2012, now U.S. Pat. No. 9,159,646, entitled "APPARATUS AND METHOD TO MONITOR DIE EDGE DEFECTS", and claims a priority benefit thereof.

BACKGROUND

Semiconductor die edge is a susceptible region to failure due to high package-to-Silicon interaction stress, direct exposure of semiconductor die edge to environment or interface with other materials, and manufacturing defects. Among the manufacturing defects, die chipping or cracking is a known reliability risk and adds to the cost of manufacturing processors on die. Die chipping or cracking at die edges may be caused by a number of reasons including laser processing, wafer sawing, die handling during assembly and test etc. FIG. 1 illustrates an apparatus 100 with a Edge Die Monitor (EDM) to detect failures or defects including those caused by cracks or chips near the edges of a die.

Apparatus 100 comprises a semiconductor die 101, wire 102, and electro-static discharge (ESD) unit 103. Wire 102 and ESD unit 103 form the EDM. Wire 102 is laid around the periphery of die 101 in an active area 104 such that it surrounds the processor active area 105. Wire 102 has an input port "In" and an output port "Out," where ESD unit 103 is coupled near the input port "In."

When voltage and current is applied to the input port "In" then the output port "Out" is monitored. The output port "Out" may be coupled to a ground node. If no current or too much current reaches the ground node at output port "Out," the EDM indicates that there is a fault in die 101 along wire 102. However, this information is not sufficient to identify where the fault in die 101 resides. Manual checks, that may take days and have low success rate, are performed to identify the crack/chip location(s) in die 101. Such manual checking often leads to product line shut-down and delay time-to-market of the product (die 101). Such manual checking is a roadblock to the square-wave ramping of High Volume Manufacturing (HVM), and leads to huge volume loss in marketable products.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 8 is a photo of a cracked die.

DETAILED DESCRIPTION

Figure 1:
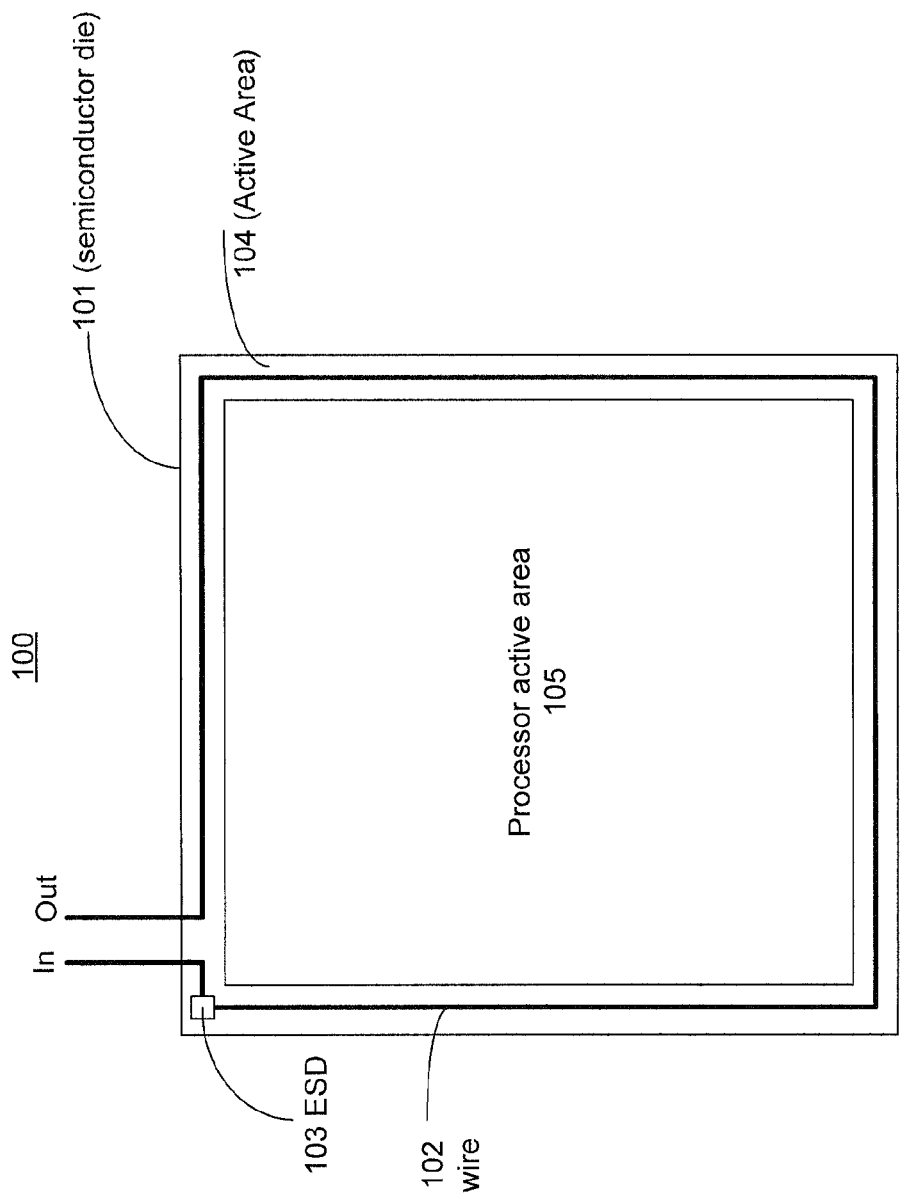
FIG. 1 illustrates an apparatus 100 with Edge Die Monitor (EDM) to detect failures including cracks or chips near edges of a die.

The embodiments describe an EDM with one or more diodes and/or resistors positioned at various locations around a periphery of a die to detect failures near the edges of the die. A curve trace is generated according to voltage and current applied at an input port of the EDM wire. The curve trace identifies sections and/or locations in the wire (and hence sections/locations of the die) which exhibit fault near the edges of the die.

In one embodiment, the apparatus including the EDM comprises: an input pad and an output pad for sending and receiving test voltage/current. In one embodiment, the apparatus further comprises a wire coupled to the input pad and the output pad, the wire positioned at a periphery of a semiconductor die. In one embodiment, the wire extends substantially along a perimeter of the semiconductor die. In one embodiment, the apparatus further comprises one or more diodes and/or resistors, coupled at various sections of the wire, and positioned along the perimeter of the semiconductor die and surrounding the semiconductor die.

In one embodiment, the input pad and the output pad are positioned to form a peripheral loop of the wire surrounding the semiconductor die. In one embodiment, the one or more diodes include: a first set of diodes (e.g., three diodes in series) coupled to the wire (of the EDM) and a ground node; a second set of diodes (e.g., two diodes in series) coupled to the wire (of the EDM) and the ground node; and a third set of diodes (e.g., a single diode) coupled to the wire (of the EDM) and the ground node.

In one embodiment, the first set of diodes turn on in forward bias at a voltage higher than a voltage to turn on the second set of diodes. In one embodiment, the second set of diodes to turn on in forward bias at a voltage higher than a voltage to turn on the third set of diodes lower. In one embodiment, the first set of diodes is positioned closer to the output node. In one embodiment, the second set of diodes is positioned between the first set of diodes and the third set of diodes. In one embodiment, the third set of diodes is positioned closer to the input node than the second set of diodes.

In one embodiment, each of the first, second, and third sets of diodes comprise a corresponding resistor. For example, in one embodiment, the first set of diodes comprises a diode coupled in series with a first resistor, the first set of diode coupled to the wire and a ground node. In one embodiment, the second set of diodes comprises a diode coupled in series with a second resistor, the second set of diodes coupled to the wire and the ground node. In one embodiment, resistance of first resistor is higher than resistance of second resistor.

In one embodiment, the one or more diodes are placed near the peripheral corners of the semiconductor die. In one embodiment, the input pad receives an input signal which is a test signal for testing edge defects of a wafer die comprising the semiconductor die. In one embodiment, the semiconductor die is a processor. In one embodiment, the output pad is coupled to a ground node. In one embodiment, the apparatus further comprises electro-static discharge (ESD) diodes coupled to the input node, and positioned near the input node.

There are many technical effects of the embodiments. Some non-limiting technical effects are described below. The embodiments of the EDM reduce through-put time (TPT). For example, EDM significantly reduces failure isolation and analysis time from weeks to days. The embodiments also make commonality analysis possible in understanding the effect of process, equipment or design on the product marginality. In one embodiment, no die sample preparation or special tool is needed for fault isolation compared to the method and apparatus of FIG. 1. Sample preparation or special tools for fault isolation generally raise the risk of damage to semiconductor die units. The embodiments of the EDM improve failure and root cause analysis success rate because of higher resolution fault isolation than the apparatus and method of FIG. 1. Other technical effects are also possible from the embodiments.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

The term "scaling" refers to converting a design (schematic and layout) from one process technology to another process technology. The terms "substantially," "close," "approximately," "near," "about," herein refer to being within +/−20% of a target value. The term "set" generally refers to a group of items (e.g., diodes, resistors, transistors, wires, etc). A set may have a single item or multiple items.

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, Bi-CMOS, CMOS, eFET, etc., may be used without departing from the scope of the disclosure. The term "MN" indicates an n-type transistor (e.g., NMOS, NPN BJT, etc) and the term "MP" indicates a p-type transistor (e.g., PMOS, PNP BJT, etc).

Figure 2:
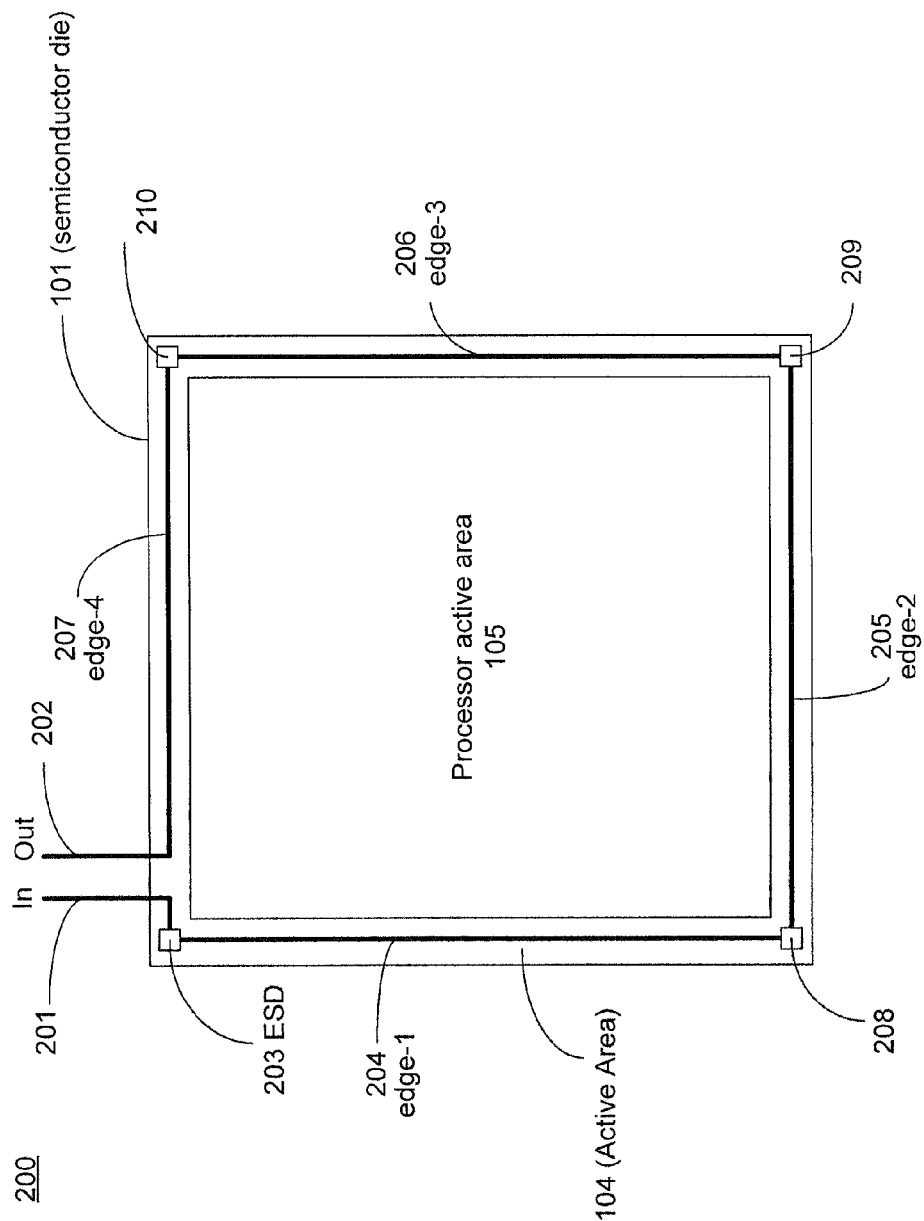
FIG. 2 an apparatus with EDM, according to one embodiment.

FIG. 2 is an apparatus 200 with EDM, according to one embodiment of the disclosure. It is pointed out that those elements of FIG. 2 having the same reference numbers (or names) as the elements of any other figure can operate or function in any manner similar to that described, but are not limited to such.

In one embodiment, apparatus 200 having EDM comprises an input port 201; an output port 202; a wire positioned along the periphery of the processor active area 105, the wire having multiple edges e.g., edge-1 204, edge-2 205, edge-3 206, and edge-4 207; and one or more sets of diodes and/or resistors 208 (first set), 209 (second set), 210 (third set). In one embodiment, the wire is positioned in active area 104 around (or surrounding) processor active area 105. The term "port" generally refers to a pin coupled to a pad, and so is interchangeably referred as "pad."

In one embodiment, input port 201 is used to provide a test signal (voltage/current) to the wire of the EDM. In one embodiment, output port 202 is coupled to ground. In one embodiment, test results are obtained at output port 202. In one embodiment, apparatus 200 further comprises an ESD unit 203 to provide ESD protection to the one or more sets of diodes and/or resistors and the wire. In one embodiment, ESD unit 203 is positioned near input port 201 on active region 104. In one embodiment, ESD unit 203 includes D1 and D2 diodes which are well known. Any structure of ESD unit 203 may be used with the embodiments.

In one embodiment, first set of diodes 208 (e.g., three diodes in series) are coupled to the wire and the ground node. In one embodiment, second set of diodes 209 (e.g., two diodes in series) are coupled to the wire and the ground node. In one embodiment, third set of diodes 210 (e.g., a single diode) is coupled to the wire and the ground node.

In one embodiment, first set of diodes 208 turn on in forward bias at a voltage higher than a voltage to turn on second set of diodes 209. In one embodiment, second set of diodes 209 turn on in forward bias at a voltage higher than a voltage to turn on third set of diodes 210. In one embodiment, first set of diodes 208 are positioned closer to output node 202. In one embodiment, second set of diodes 209 is positioned between first set of diodes 208 and third set of diodes 210. In one embodiment, third set of diodes 210 is positioned closer to input node 201 than second set of diodes 209.

In one embodiment, each of first 208, second 209, and third 210 sets of diodes comprise a corresponding resistor. For example, in one embodiment, first set of diodes 208 comprises diode(s) coupled in series with a first resistor, where first set of diode 208 coupled to the wire and a ground node. For example, a resistor is coupled in series with three diodes, where the resistor is coupled to edge-1 204 and one of the three diodes, and where the last of the three diodes (not coupled to the resistor) is coupled to ground. In another embodiment, the resistor is coupled in series with three diodes, where one of the three diodes is coupled to edge-1

204 while the last of the three diodes is coupled to one end of a resistor while the other end of the resistor is coupled to ground.

In one embodiment, second set of diodes 209 comprises diode(s) coupled in series with a second resistor, where second set of diode(s) 209 is coupled to the wire and the ground node. For example, a resistor is coupled in series with two diodes, where the resistor is coupled to edge-2 205 and one of the two diodes, and where the last of the two diodes (not coupled to the resistor) is coupled to ground. In another embodiment, the resistor is coupled in series with two diodes, where one of the two diodes is coupled to edge-2 205 while the other diode in series with the first diode and is coupled to one end of a resistor while the other end of the resistor is coupled to ground.

In one embodiment, third set of diodes 210 comprises diode(s) coupled in series with a third resistor, where third set of diode(s) 210 is coupled to the wire and the ground node. For example, a resistor is coupled in series with a diode, where the resistor is coupled to edge-3 206 and the diode, and where the diode is coupled to ground. In another embodiment, the resistor is coupled in series with the diode, where one end of the diode is coupled to edge-3 206 while the other end of the diode is coupled in series with a resistor which is also coupled to ground.

While the embodiments describe diodes and resistors in the sets of diodes 208, 209, and 210, other devices may used in the sets of diodes. For example, the sets of diodes may have only resistors, only diodes, only transistors, combination of diodes and resistors, combination of transistors, diodes, and resistors, arranged in any manner. In one embodiment, the effective turn on voltage of first set of diodes 208 is higher than the effective turn on voltage of second set of diodes 209. In one embodiment, the effective turn on voltage of second set of diodes 209 is higher than the effective turn on voltage of third set of diodes 210. In one embodiment, resistance of first resistor is higher than resistance of second resistor, and the resistance of the second resistor is higher than the resistance of the third resistor. In other embodiments, the resistances of the first, second, and third resistances are equal.

In one embodiment, first, second, and third sets of diodes (208, 209, and 210) are coupled to their respective sections of the wire in that order. In such an embodiment, failure results (as in cracks and chips on the die) are efficiently identifiable by the shape of the IV (Current-voltage) curves for the first, second, and third sets of diodes.

Figure 3:
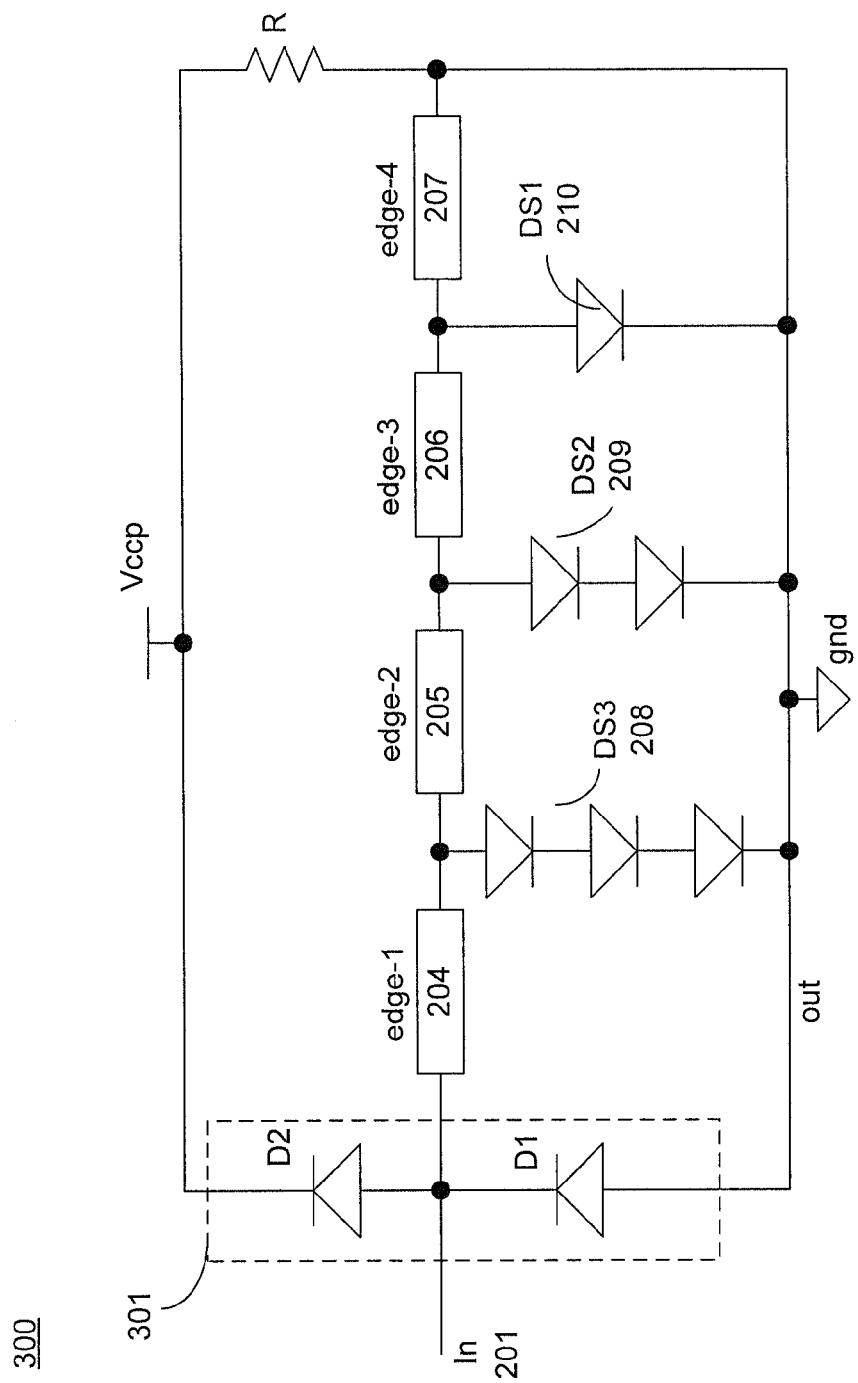
FIG. 3 is circuit model of the EDM, according to one embodiment.

FIG. 3 is a circuit model 300 of the EDM (e.g., of apparatus 200), according to one embodiment of the disclosure. It is pointed out that those elements of FIG. 3 having the same reference numbers (or names) as the elements of any other figure can operate or function in any manner similar to that described, but are not limited to such.

In one embodiment, circuit model 300 comprises ESD unit 301 coupled to input port "In" 201. In one embodiment, ESD unit 301 comprises D1 and D2 diodes coupled together to Vccp (power supply) and ground as shown. In other embodiments, other structures for ESD unit 301 may be used.

Circuit model 300 illustrates edges 204, 205, 206, and 207 as sections of interconnect coupled together in series. In one embodiment, circuit model 300 comprises first set of diodes 208 including three diodes DS3 coupled together in series as shown, such that one end of first set of diodes 208 is coupled to the wire while the other end of first set of diodes 208 is coupled to ground. In this embodiment, first set of diodes 208 is coupled on the intersection of edge-1 204 and edge-2 205.

In one embodiment, circuit model 300 comprises second set of diodes 209 including three diodes DS2 coupled together in series as shown, such that one end of second set of diodes 209 is coupled to the wire while the other end of second set of diodes 209 is coupled to ground. In this embodiment, second set of diodes 209 is coupled on the intersection of edge-2 205 and edge-3 206.

In one embodiment, circuit model 300 comprises third set of diodes 210 including a single diode DS1, such that one end of third set of diodes 210 is coupled to the wire while the other end of third set of diodes 210 is coupled to ground. In this embodiment, third set of diodes 210 is coupled on the intersection of edge-3 206 and edge-4 207. In one embodiment, resistor R is coupled between edge-4 207 and Vccp to model the return path, where Vccp is a power supply.

In one embodiment, first, second, and third sets of diodes (208, 209, and 210) are coupled to their respective sections of the wire in that order. In such an embodiment, failure results (as in cracks and chips near edges of die 101) are efficiently identifiable by the shape of the IV (Current-voltage) curves for the first, second, and third sets of diodes. However, the ordering of the sets of diodes is not limited to the order shown in FIG. 3. Other ordering of the sets of diodes may be used to identify failures (e.g., cracks and/or chips) in the periphery of the die 101.

Figure 4:
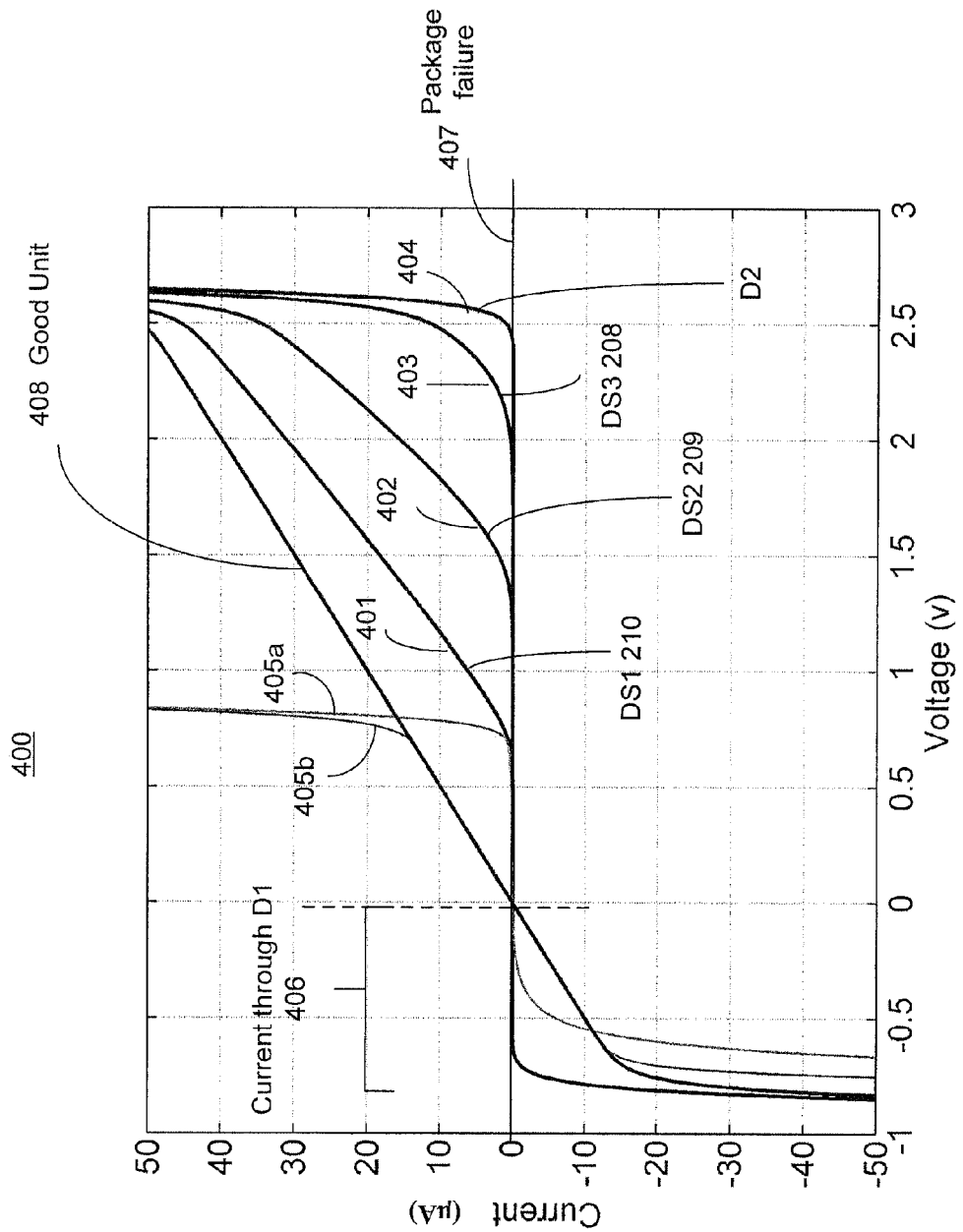
FIG. 4 is a plot showing function of the EDM, according to one embodiment of the disclosure.

FIG. 4 is a plot 400 showing function of the EDM (e.g., 300), according to one embodiment of the disclosure. It is pointed out that those elements of FIG. 4 having the same reference numbers (or names) as the elements of any other figure can operate or function in any manner similar to that described, but are not limited to such.

The x-axis of the plot is voltage (V) and the y-axis is current (in $\mu A$). Plot 400 illustrates seven waveforms 401, 402, 403, 404, 405, 407, and 408. In the following example, the turn on voltage of a diode is assumed to be 0.6V. In one embodiment, the voltage (e.g., Vccp) at the "In" port 201 is swept from −1V to 3V (see x-axis) and current is measured at the "Out" node port 202, which is coupled to ground. Depending on the failure location (i.e., location of the crack/chip) near the edge of the die 101, a distinct IV curve signature is achieved.

The signature of current at output 202, when port 201 is swept from −1V to 0V, is illustrated by section 406 which is the current through ESD diode D1. Once the voltage on 201 reaches a turn on voltage for a diode (e.g., 0.6V), then depending on the location of the failure, an IV curve is achieved at 202. For example, if the horizontal IV curve 407 is achieved, it indicates a package failure, where package contains die 101. If IV curve 408 is achieved, it indicates a good unit (i.e., die 101 with no cracks/chips on the periphery of die 101) is tested with Vccp biased at 1.8V, for example. If the IV curve follows curve 401, then there is an open failure associated with edge-4 207. In one embodiment, since third set of diodes DS1 210 comprises a single diode, if it turns on, it will turn on around 0.6V (which is the turn on voltage of a single diode in forward bias region). For example, curve 401 illustrates that periphery of die 101 is good (i.e., intact) through edge-3 206, and that the failure in the periphery of die 101 is on edge-4 207. Such identification of failures is not possible with the EDM architecture of FIG. 1.

If the IV curve follows curve 402, then the open failure is associated with edge-3 206. In one embodiment, since second set of diodes DS2 209 comprises two diodes coupled together in series, if they turn on, they will turn on around 1.2V (which is the turn on voltage of two series connected diodes in forward bias region). For example, curve 402 illustrates that periphery of die 101 is good (i.e., intact) through edge-2 205, and that the failure in the periphery of die 101 is associated with edge-3 206.

If the IV curve follows curve 403, then the open failure is associated with edge-2 205. In one embodiment, since first set of diodes DS3 208 comprises three diodes coupled together in series, if they turn on, they will turn on around 1.8V (which is the turn on voltage of three series connected diodes in forward bias region). For example, curve 403 illustrates that periphery of die 101 is good (i.e., intact) through edge-1 204, and that the failure in the periphery of die 101 is associated with edge-2 205.

If the IV curve follows curve 404, then the open failure is associated with edge-1 204 and the periphery of die 101 is good through D1. Curve 404 is achieved when Vccp is biased at 1.8V and D2 turns on around 2.4V because no current can flow through the EDM. The two IV curves 405*a* and 405*b* illustrate the test responses of the prior art design illustrated by FIG. 1. There is no benefit of biasing Vccp for the prior art design. IV curve 405*b* shows a good unit tested without Vccp bias, while IV curve 405*a* indicates a failed unit tested without Vccp bias when failure is inside silicon past the ESD diode 103. As explained before, there is no way to isolate the failure to any segment of the EDM structure with the design of FIG. 1.

Figure 5:
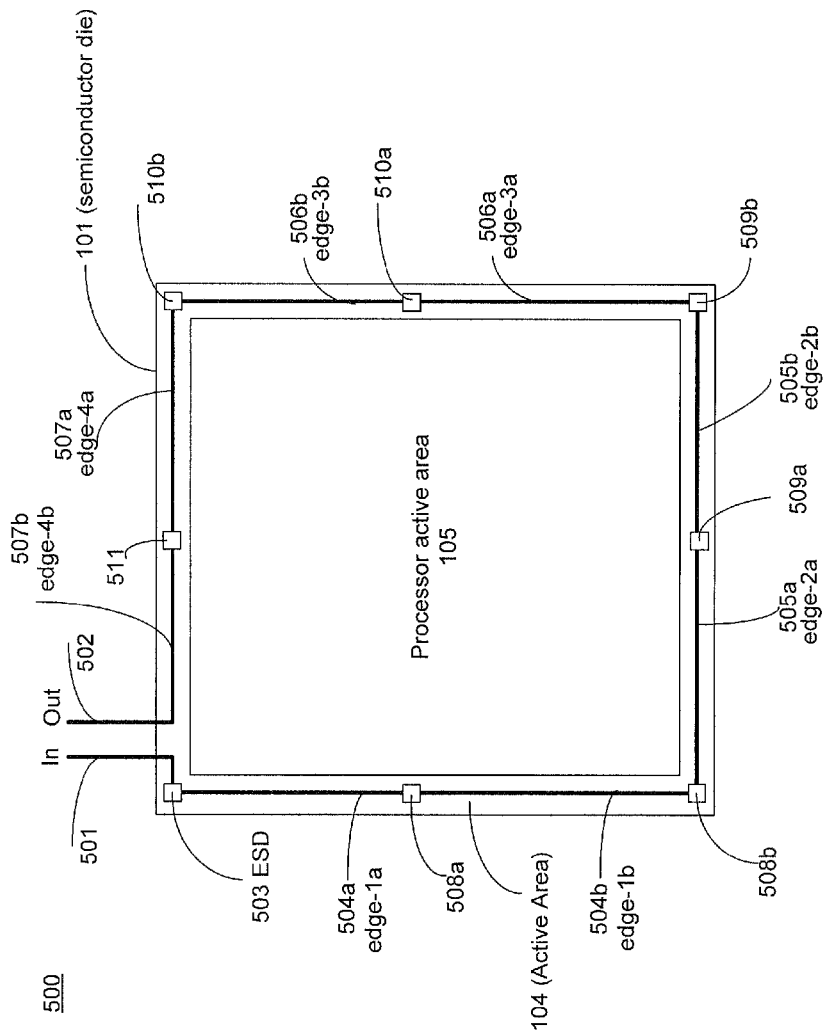
FIG. 5 an apparatus with EDM, according to another embodiment.

FIG. 5 is an apparatus 500 with an EDM, according to another embodiment of the disclosure. It is pointed out that those elements of FIG. 5 having the same reference numbers (or names) as the elements of any other figure can operate or function in any manner similar to that described, but are not limited to such. The embodiment of FIG. 5 is similar to the embodiment of FIG. 2 except that there are more sets of diodes to provide more granularity in isolating and detecting faults in the edge (or periphery) of die 101.

In one embodiment, apparatus 500 having the EDM comprises an input port 501; an output port 502; a wire positioned along the periphery of the processor active area 105, the wire having multiple edges e.g., edge-1*a* 504*a*, edge-1*b* 504*b*, edge-2*a* 505*a*, edge-2*b* 505*b*, edge-3*a* 506*a*, edge-3*b* 506*b*, edge-4*a* 507*a*, edge-4*b* 507*b*; and one or more sets of diodes and/or resistors 508*a* (first set), 508*b* (second set), 509*a* (third set), 509*b*, (fourth set), 510*a* (fifth set), 510*b* (sixth set), and 511 (seventh set). In one embodiment, the wire is positioned in active area 104 around (or surrounding) processor active area 105.

In one embodiment, input port 501 is used to provide a test signal (voltage/current) to the wire. In one embodiment, output port 502 is coupled to ground. In one embodiment, test results are obtained at output port 502. In one embodiment, apparatus 500 further comprises an ESD unit 503 to provide ESD protection to the one or more sets of diodes and/or resistors and the wire. In one embodiment, ESD unit 503 is positioned near input port 501 in active region 104. In one embodiment, ESD unit 503 includes D1 and D2 diodes which are well known.

In one embodiment, first set of diodes 508*a* (e.g., seven diodes in series) are coupled to the wire and a ground node. In one embodiment, second set of diodes 508*b* (e.g., six diodes in series) are coupled to the wire and a ground node. In one embodiment, third set of diodes 509*a* (e.g., five diodes in series) are coupled to the wire and a ground node. In one embodiment, fourth set of diodes 509*b* (e.g., four diodes in series) are coupled to the wire and a ground node. In one embodiment, fifth set of diodes 510*a* (e.g., three diodes in series) are coupled to the wire and a ground node. In one embodiment, sixth set of diodes 510*b* (e.g., two diodes in series) are coupled to the wire and a ground node. In one embodiment, seventh set of diodes 511 (e.g., a single diode) is coupled to the wire and the ground node.

In one embodiment, first set of diodes 508*a* turns on in forward bias at a voltage higher than a voltage to turn on the second set of diodes 508*b*. In one embodiment, second set of diodes 508*b* turn on in forward bias at a voltage higher than a voltage to turns on the third set of diodes 509*a*. In one embodiment, third set of diodes 509*a* turns on in forward bias at a voltage higher than a voltage to turn on the fourth set of diodes 509*b*. In one embodiment, fourth set of diodes 509*b* turns on in forward bias at a voltage higher than a voltage to turn on the fifth set of diodes 510*a*. In one embodiment, sixth set of diodes 510*b* turns on in forward bias at a voltage higher than a voltage to turn on the seventh set of diodes 511.

In one embodiment, first set of diodes 508*a* are positioned closer to the input port 501. In one embodiment, second set of diodes 508*b* is positioned between first set of diodes 508*a* and third set of diodes 509*a*. In one embodiment, third set of diodes 509*a* is positioned between second set of diodes 508*b* and fourth set of diodes 509*b*. In one embodiment, fourth set of diodes 509*b* is positioned between third set of diodes 509*a* and fifth set of diodes 510*a*. In one embodiment, fifth set of diodes 510*a* is positioned between fourth set of diodes 509*b* and sixth set of diodes 510*b*. In one embodiment, sixth set of diodes 510*b* is positioned between fifth set of diodes 510*a* and seventh set of diodes 511. In one embodiment, seventh set of diodes 511 is positioned closer to the output port 502 than the sixth set of diodes 510*b*.

In one embodiment, each of first 508*a*, second 508*b*, third 509*a*, fourth 509*b*, fifth 510*a*, sixth 510*b*, and seventh 511 sets of diodes comprise a corresponding resistor. For example, in one embodiment, first set of diodes 508*a* comprises diode(s) coupled in series with a first resistor, where first set of diode 508*a* is coupled to the wire and a ground node. For example, a resistor is coupled in series with seven diodes, where the resistor is coupled to edge-1*a* 504*a* and one of the seven diodes, and where the last of the seven diodes (not coupled to the resistor) is coupled to ground. In another embodiment, the resistor is coupled in series with seven diodes, where one of the seven diodes is coupled to edge-1*a* 504*a* while the last of the seven diodes is coupled to one end of a resistor while the other end of the resistor is coupled to ground. Similar coupling of resistors is performed for other sets of diodes.

While the embodiments describe diodes and resistors in the sets of diodes—508*a*, 508*b*, 509*a*, 509*b*, 510*a*, 510*b*, and 511—other devices may be used in the sets of diodes. For example, the sets of diodes may have only resistors, only diodes, only transistors, combination of diodes and resistors, combination of transistors, diodes, and resistors, arranged in any manner.

In one embodiment, sets of diodes—508*a*, 508*b*, 509*a*, 509*b*, 510*a*, 510*b*, and 511—are coupled to their respective sections of the wire in that order. In such an embodiment, failure results (as in cracks and chips on the die) are efficiently identifiable by the shape of the IV curves for the sets of diodes. While the embodiments show three or seven sets of diodes, any number of sets of diodes may be placed along the wire to adjust granularity of fault detection along the periphery of die 101.

Figure 6:
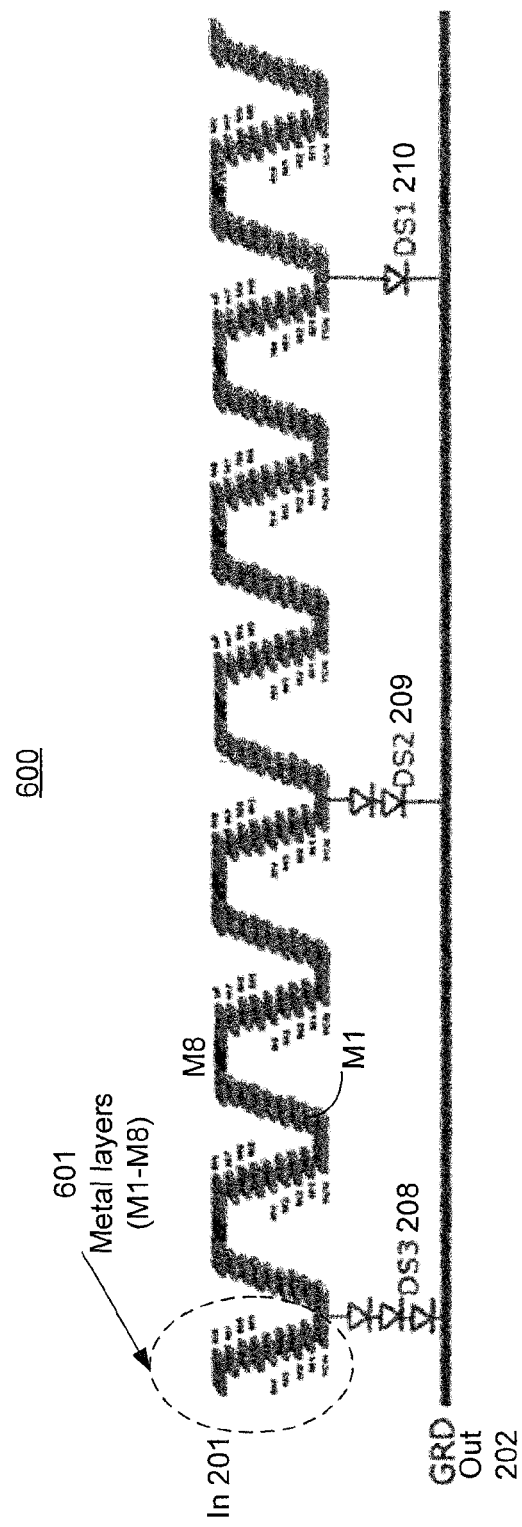
FIG. 6 is part of the EDM, according to one embodiment of the disclosure.

FIG. 6 is part 600 of the EDM, according to one embodiment of the disclosure. It is pointed out that those elements of FIG. 6 having the same reference numbers (or names) as the elements of any other figure can operate or function in any manner similar to that described, but are not limited to such. FIG. 6 is described with reference to FIG. 3.

The embodiment of 600 illustrates a process technology with at least eight metal layers 601 (Metal 1 to Metal 8 i.e., M1-M8). In one embodiment, input port "In" 201 is coupled to the highest metal layer M8. In other embodiments, other metal layers may be used to receive input port 201. In one embodiment, any metal layer (e.g., M8) may be used for the output port 202 which is coupled to ground. The embodiment 600 illustrates the layout of the EDM (e.g., 300), where one end of the sets of diodes—208, 209, and 210—is coupled to the lowest layer (e.g., poly) from among the stack of connecting layers (e.g., M1-M8).

Figure 7A:
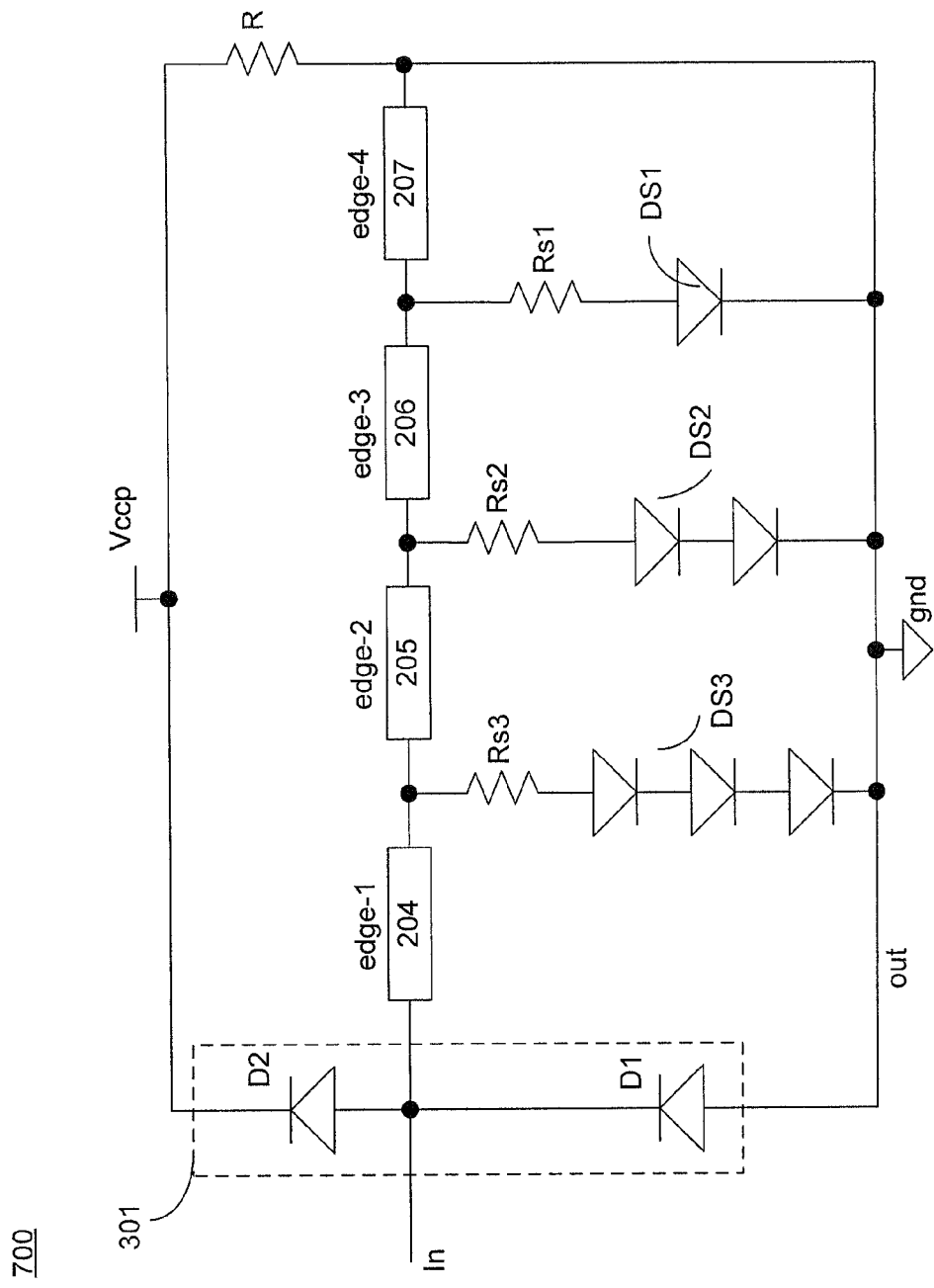
FIG. 7A is a circuit model of EDM with diodes and resistors, according to one embodiment of the disclosure.

FIG. 7A is a circuit model 700 of an EDM with diodes and resistors, according to one embodiment of the disclosure. It is pointed out that those elements of FIG. 7A having the same reference numbers (or names) as the elements of any other figure can operate or function in any manner similar to that described, but are not limited to such.

The embodiment of FIG. 7A is similar to the embodiment of FIG. 3, except that resistors Rs3, Rs2, and Rs1 are coupled to first, second, and third sets of diodes (DS3, DS2, and DS1) respectively. In one embodiment, resistors Rs3, Rs2, and Rs1 are identical. In other embodiments, resistors Rs3, Rs2, and Rs1 have different resistances. For example, resistance of Rs3 is higher than resistance of Rs2, and where resistance of Rs2 is higher than resistance of Rs1. While the embodiments show the resistors Rs3, Rs2, and Rs1 coupled at one end to the wire (one of the edges of the wire) and coupled at the other end to an end of the set of diodes, the resistors Rs3, Rs2, and Rs1 can be positioned anywhere in the series connection of diodes and resistors.

Figure 7B:
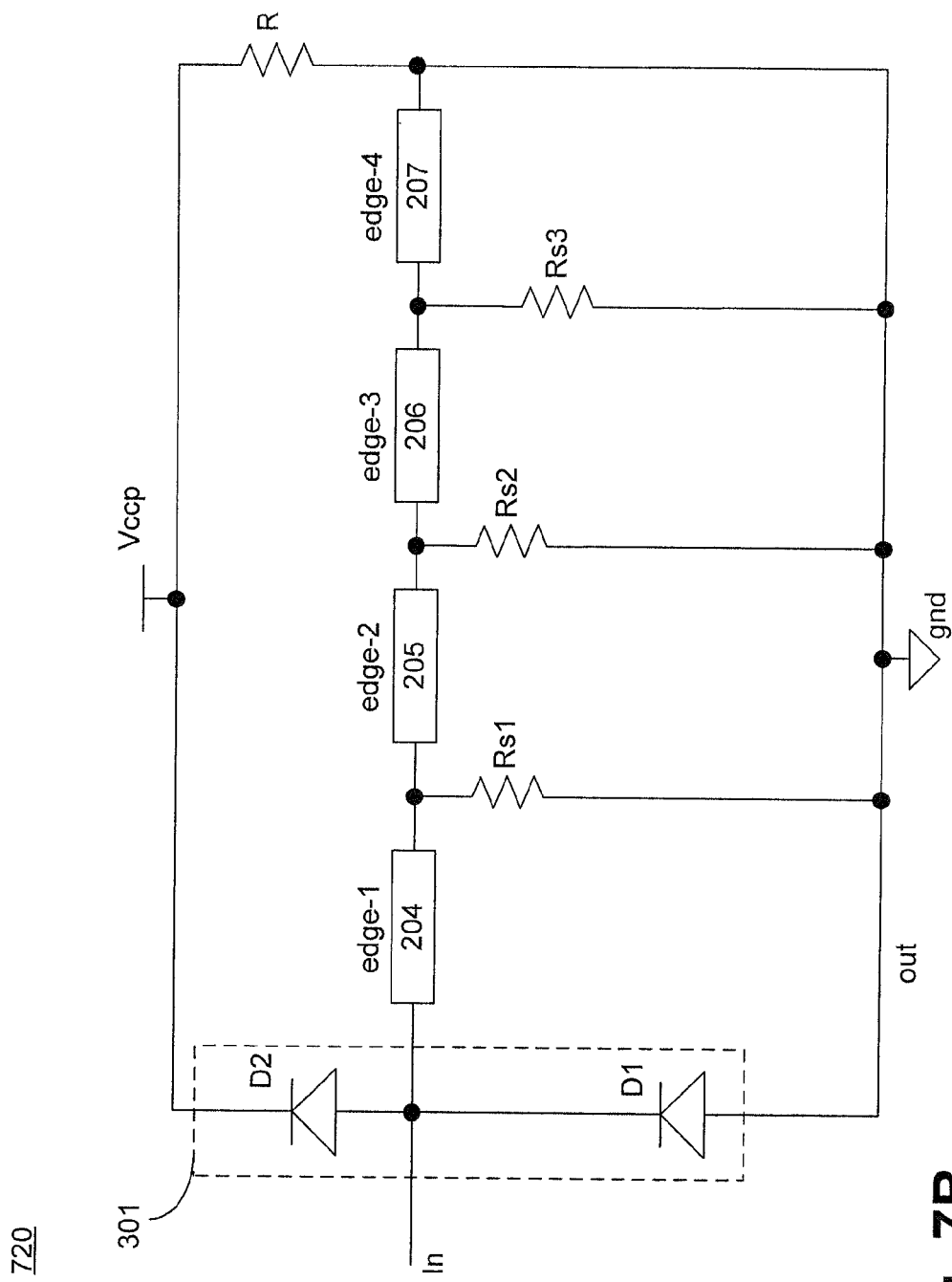
FIG. 7B is a circuit model of EDM with resistors, according to one embodiment of the disclosure.

FIG. 7B is a circuit model 720 of an EDM with resistors, according to one embodiment of the disclosure. It is pointed out that those elements of FIG. 7B having the same reference numbers (or names) as the elements of any other figure can operate or function in any manner similar to that described, but are not limited to such.

The embodiment of FIG. 7B is similar to the embodiment of FIG. 3, but uses resistors only instead of diodes. In one embodiment, first set of diodes 208 is replaced with first resistor Rs1. In one embodiment, second set of diodes 209 is replaced with second resistor Rs2. In one embodiment, third set of diodes 210 is replaced with third resistor Rs1. In this embodiment, resistance of Rs1 is greater than resistance of Rs2, and resistance of Rs3 is greater than resistance of Rs3. In another embodiment, resistance of Rs3 is greater than resistance of Rs2, and resistance of Rs2 is greater than resistance of Rs1. While the embodiment of FIG. 7B illustrates three sets of resistors (Rs1, Rs2, and Rs3), any number of resistors can be placed along the wire (coupling the wire to ground) and the shape of the IV curves (that can be uniquely identifiable for each resistor) can be used to determine faults in the edges of die 101.

FIG. 8 is a photo 800 of a cracked die. It is pointed out that those elements of FIG. 8 having the same reference numbers (or names) as the elements of any other figure can operate or function in any manner similar to that described, but are not limited to such. The highlighted section 801 illustrates a crack in the corner of die 101, where processor die 105 is surrounded by the EDM discussed in the embodiments. Such crack or chip in die 101 including its location can be detected by the EDM discussed in the embodiments.

Figure 9:
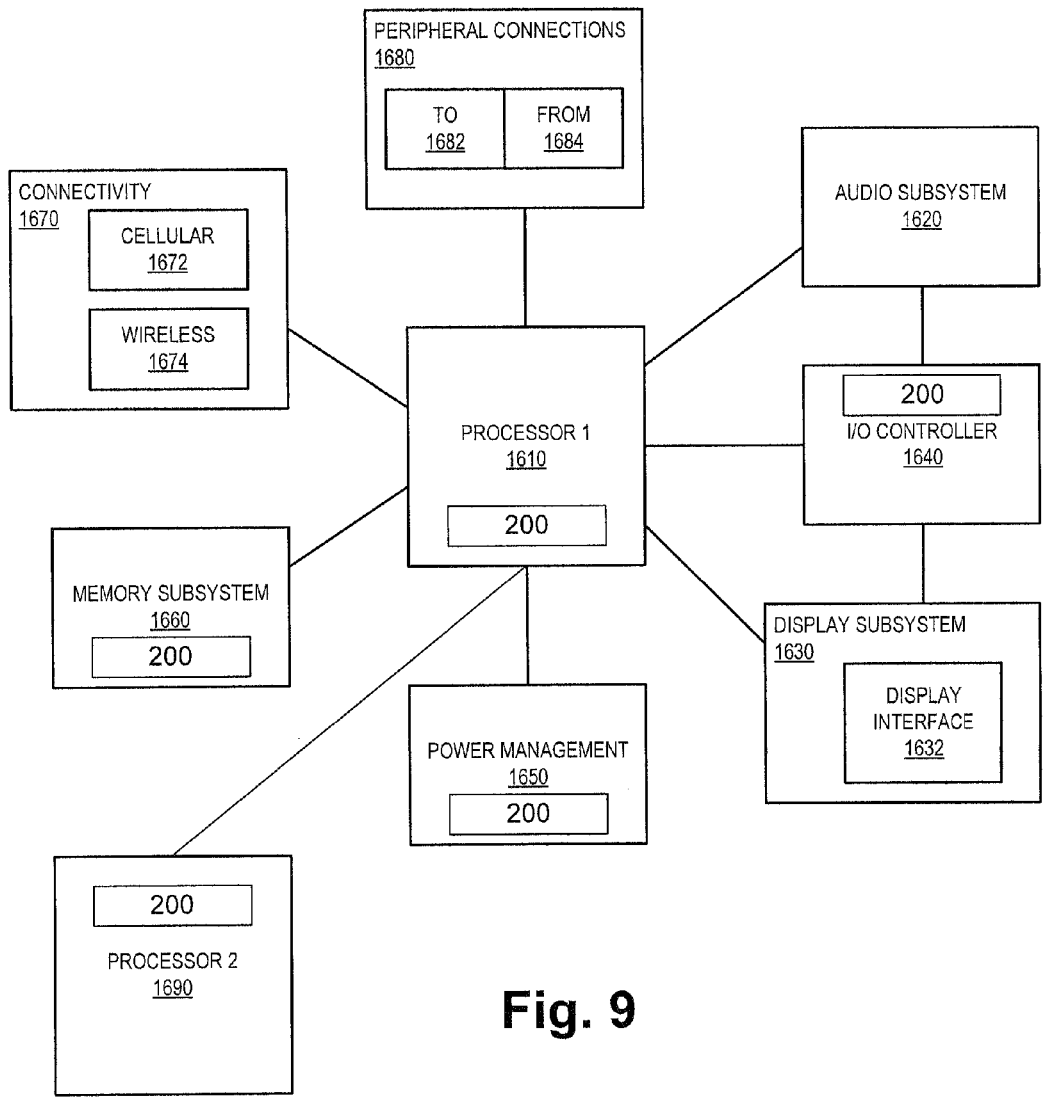
FIG. 9 is a smart device or a computer system with the EDM, according to one embodiment of the disclosure.

FIG. 9 is a smart device 1600 or a computer system with the EDM, according to one embodiment of the disclosure. It is pointed out that those elements of FIG. 9 having the same reference numbers (or names) as the elements of any other figure can operate or function in any manner similar to that described, but are not limited to such. FIG. 9 also illustrates a block diagram of an embodiment of a mobile device in which flat surface interface connectors could be used. In one embodiment, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, computing device 1600 includes a first processor 1610 with the EDM discussed in the embodiments, and a second processor 1690 with the EDM discussed in the embodiments, according to the embodiments discussed herein. Other blocks of the computing device with I/O drivers may also include the EDM discussed in the embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, an apparatus comprises: an input pad; an output pad; a wire, coupled to the input pad and the output pad, the wire positioned at a periphery of a semiconductor die, the wire extending substantially along a perimeter of the semiconductor die; and one or more diodes, coupled at various sections of the wire, and positioned along the perimeter of the semiconductor die and surrounding the semiconductor die. In one embodiment, the input pad and the output pad are positioned to form a peripheral loop of the wire surrounding the semiconductor die. In one embodiment, the one or more diodes include: a first set of diodes coupled to the wire and a ground node; a second set of diodes coupled to the wire and the ground node; and a third set of diodes coupled to the wire and the ground node.

In one embodiment, the first set of diodes turn on in forward bias at a voltage higher than a voltage to turn on the second set of diodes. In one embodiment, the second set of diodes turn on in forward bias at a voltage higher than a voltage to turn on the third set of diodes lower. In one embodiment, the first set of diodes is positioned closer to the output node, wherein the second set of diodes is positioned between the first set of diodes and the third set of diodes, and wherein the third set of diodes is positioned closer to the input node than the second set of diodes. In one embodiment, each of the first, second, and third sets of diodes comprise a corresponding resistor.

In one embodiment, the first set of diodes comprises a diode coupled in series with a first resistor, the first set of diode coupled to the wire and a ground node. In one embodiment, the second set of diodes comprises a diode coupled in series with a second resistor, the second set of diodes coupled to the wire and the ground node. In one embodiment, resistance of first resistor is higher than resistance of second resistor. In one embodiment, the one or more diodes are placed near the peripheral corners the semiconductor die. In one embodiment, the input pad to receive and input signal which is a test signal for testing edge defects of a wafer die comprising the semiconductor die. In one embodiment, the semiconductor die is a processor. In one embodiment, the output pad is coupled to a ground node. In one embodiment, the apparatus further comprises electrostatic discharge (ESD) diodes coupled to the input node, and positioned near the input node.

In another example, a semiconductor die comprises: a processor region; an input pad to provide an input signal; an output pad; a wire, coupled to the input pad and the output pad, the wire positioned at a periphery of the processor region, the wire extending substantially along a perimeter of the processor region; and one or more diodes, coupled at various sections of the wire, and positioned along the perimeter of the processor region and surrounding the processor region.

In one embodiment, the one or more diodes include: a first set of diodes coupled to the wire and a ground node; a second set of diodes coupled to the wire and the ground node; and a third set of diodes coupled to the wire and the ground node. In one embodiment, the first set of diodes to turn on in forward bias at a voltage higher than a voltage to turn on the second set of diodes; the second set of diodes to turn on in forward bias at a voltage higher than a voltage to turn on the third set of diodes lower; and the first set of diodes is positioned closer to the output node, wherein the second set of diodes is positioned between the first set of diodes and the third set of diodes, and wherein the third set of diodes is positioned closer to the input node than the second set of diodes.

In another example, a system comprises: a memory unit; a package, coupled to the memory unit, the package comprising: a processor region; an input pad to provide an input signal; an output pad; a wire, coupled to the input pad and the output pad, the wire positioned at a periphery of the processor region, the wire extending substantially along a perimeter of the processor region; and one or more diodes, coupled at various sections of the wire, and positioned along the perimeter of the processor region and surrounding the processor region. In one embodiment, the processor region comprises: a cache; one or more processor cores; and power control unit.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
an input pad;
an output pad;
a wire coupled to the input pad and the output pad the wire extending substantially along a perimeter of a die; and
a first set of devices coupled to a first section of the wire at a first location along the perimeter of the die to provide a first voltage to identify a fault at the first location;
a second set of devices coupled to a second section of the wire at a second location along the perimeter of the die to provide a second voltage to identify a fault at the second location, wherein the first voltage that identifies the fault at the first location is different from the second voltage that identifies the fault at the second location.

2. The apparatus of claim 1, wherein the first set of devices is to provide a forward bias voltage that is greater than the forward bias voltage of the second set of devices.

3. The apparatus of claim 1, wherein the first set of devices is to provide a resistance that is greater than the resistance of the second set of devices.

4. The apparatus of claim 1, wherein each of the first set of devices and the second set of devices comprises at least one of a diode or a resistor.

5. The apparatus of claim 1, further comprising
a third set of devices coupled to a third section of the wire at a third location along the perimeter of the die.

6. The apparatus of claim 1, wherein the first set of devices is coupled to a ground node.

7. The apparatus of claim 1, wherein a number of the first set of devices is greater than the number of the second set of devices.

8. The apparatus of claim 1, wherein each of the first set of devices and the second set of devices comprises a diode coupled in series with a resistor.

9. The apparatus of claim 1, wherein the input pad is to receive a test signal for testing edge defects of the die.

10. The apparatus of claim 1, further comprising a processor coupled to the die.

11. The apparatus of claim 1, wherein the output pad is coupled to a ground node.

12. The apparatus of claim 1 further comprising an electro-static discharge (ESD) unit coupled to the input node.

13. The apparatus of claim 1, wherein the first set of devices is coupled to a first metal layer, and the input pad is coupled to a second metal layer that is above the first metal layer.

14. A system comprising:
a memory unit;
a package, coupled to the memory unit, the package comprising:
a processor region;
an input pad to provide an input signal;
an output pad;
a wire coupled to the input pad and the output pad, the wire extending substantially along a perimeter of the processor region; and
a plurality of sets of devices coupled to various sections of the wire at a plurality of locations along the perimeter of the processor region, wherein the plurality of the sets of devices is to provide a current voltage characteristic that depends on a fault location at the processor region.

15. The system of claim 14, wherein the plurality of sets of devices comprise
a first set of devices coupled to a first section of the wire at a first location along the perimeter of the die and a ground node; and
a second set of devices coupled to a second section of the wire at a second location along the perimeter of the die and the ground node; wherein the first set of devices is to provide a forward bias voltage higher than a forward bias voltage of the second set of devices.

16. The system of claim 14, wherein the processor region comprises
one or more processor cores coupled to the memory unit.

17. The system of claim 14, wherein each of the sets of devices comprises at least one of a diode or a resistor.

18. The apparatus of claim 14, wherein one of the sets of devices is to provide a resistance greater than the resistance of other one of the sets of devices.

19. The apparatus of claim 14, wherein the output pad is coupled to a ground node.

20. The apparatus of claim 14, further comprising
an electro-static discharge (ESD) unit coupled to the input node.

* * * * *